United States Patent
Chuang et al.

(10) Patent No.: US 11,076,483 B2
(45) Date of Patent: Jul. 27, 2021

(54) DIRECT BONDED COPPER CERAMIC SUBSTRATE

(71) Applicant: INDUSTRIAL TECHNOLOGY RESEARCH INSTITUTE, Hsinchu (TW)

(72) Inventors: Kai-Hsiang Chuang, Zhudong Township (TW); Chien-Chiang Hsu, Taichung (TW); Chien-Chung Hsu, Taichung (TW); Kuo-Chuang Chiu, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 5 days.

(21) Appl. No.: 16/721,509

(22) Filed: Dec. 19, 2019

(65) Prior Publication Data

US 2021/0161006 A1 May 27, 2021

(30) Foreign Application Priority Data

Nov. 26, 2019 (TW) .................. 108142898

(51) Int. Cl.
*B32B 15/04* (2006.01)
*H05K 1/03* (2006.01)
*C04B 37/02* (2006.01)

(52) U.S. Cl.
CPC ......... *H05K 1/0306* (2013.01); *C04B 37/021* (2013.01); *C04B 2237/341* (2013.01); *C04B 2237/343* (2013.01); *C04B 2237/407* (2013.01)

(58) Field of Classification Search
None
See application file for complete search history.

(56) References Cited

U.S. PATENT DOCUMENTS

| | | | |
|---|---|---|---|
| 2,570,248 A | 10/1951 | Kelley | |
| 3,766,634 A | 10/1973 | Babcock et al. | |
| 3,994,430 A | 11/1976 | Cusano et al. | |
| 5,912,066 A * | 6/1999 | Takahashi | C04B 37/025 428/195.1 |
| 6,066,219 A * | 5/2000 | Schulz-Harder | C04B 37/025 156/307.1 |

(Continued)

FOREIGN PATENT DOCUMENTS

| | | |
|---|---|---|
| CN | 104105678 A | 10/2014 |
| CN | 103762181 B | 12/2018 |
| TW | I503061 B | 10/2015 |

OTHER PUBLICATIONS

Taiwanese Office Action and Search Report, dated Jun. 8, 2020, for Taiwanese Application No. 108142898.

*Primary Examiner* — Seth Dumbris

(74) *Attorney, Agent, or Firm* — Birch, Stewart, Kolasch & Birch, LLP.

(57) ABSTRACT

A direct bonded copper ceramic substrate is provided, which includes a nitride ceramic substrate, a first passivation layer, and a first copper layer. The first passivation layer includes aluminum oxide or silicon oxide doped with another metal. The other metal is titanium, vanadium, chromium, manganese, iron, cobalt, nickel, copper, or a combination thereof. The aluminum or silicon and the other metal have a weight ratio of 60:40 to 99.5:0.5. The first passivation layer is disposed between the top surface of the nitride ceramic substrate and the first copper layer.

10 Claims, 2 Drawing Sheets

(56) References Cited

U.S. PATENT DOCUMENTS

| | | | |
|---|---|---|---|
| 2012/0045657 A1* | 2/2012 | Schulz-Harder | H05K 3/38 |
| | | | 428/623 |
| 2014/0338162 A1* | 11/2014 | Schulz-Harder | C04B 37/021 |
| | | | 29/17.3 |
| 2019/0069396 A1 | 2/2019 | Oka et al. | |
| 2019/0182962 A1 | 6/2019 | Gong et al. | |

* cited by examiner

DIRECT BONDED COPPER CERAMIC SUBSTRATE

CROSS REFERENCE TO RELATED APPLICATIONS

The present application is based on, and claims priority from, Taiwan Application Serial Number 108142898, filed on Nov. 26, 2019, the disclosure of which is hereby incorporated by reference herein in its entirety.

TECHNICAL FIELD

The technical field relates to a direct bonded copper ceramic substrate and a method for manufacturing the same.

BACKGROUND

As the market for electric vehicles grows, there is an increasing demand for IGBT power modules used for controlling the output voltage and current of a motor engine. While the acceleration performance of the power module is better, the voltage and current for the power module are also increasingly higher (>1200V, >800 A), in which a technology of a direct bonded copper ceramic substrate for packaging an IGBT chip is increasingly important. The direct bonded copper ceramic substrate may sustain high voltage and high current, and simultaneously have properties such as high structural strength, high thermal conductivity, high thermal cycle reliability, and the like.

One structure of a direct bonded copper ceramic substrate is a ceramic substrate having a top surface and a bottom surface bonded to copper foils with a thickness of greater than 0.1 mm. The most common materials used to make the middle ceramic substrate are aluminum oxide ($Al_2O_3$), zirconium toughened aluminum oxide (ZTA), aluminum nitride (AlN), silicon nitride ($Si_3N_4$), and the like. With these materials, the AlN ceramic substrate has the best thermal conductivity (e.g. coefficient of thermal conductivity greater than 180 W/m·K, which is much higher than that of aluminum oxide, 30 W/m·K). In addition, the coefficient of thermal expansion of AlN is similar to that of a wafer material (such as Si, Ge, and the like). Moreover, $Si_3N_4$ ceramic simultaneously has strength and thermal conductivity, which is a ceramic substrate material with high thermal recyclable reliability.

In general, the direct bonded copper ceramic substrate is fabricated by a direct bonded copper method, in which a ceramic substrate is covered by a surface treated copper foil and heated under an inert atmosphere to 1050° C. to 1080° C., so that the copper oxide of the copper foil surface bonds to the ceramic substrate.

When the aluminum nitride is utilized as a ceramic substrate, the surfaces of the aluminum nitride ceramic substrate need an additional treatment (e.g. oxidation) to form stable inert passivation layers. However, the copper oxide and the surfaces of the aluminum nitride without oxidation will react to generate gas, thereby forming bubbles in the interface between the copper foil and the ceramic substrate. The bubbles may lower the bonding strength, thermal conductivity, and reliability of the copper foil and the ceramic substrate.

Accordingly, a novel direct bonded copper ceramic substrate is called for to address the above problems.

SUMMARY

One embodiment of the disclosure provides a direct bonded copper ceramic substrate, a first passivation layer, and a first copper layer. The direct bonded copper ceramic substrate includes a nitride ceramic substrate. The first passivation layer includes aluminum oxide or silicon oxide doped with another metal. The other metal is titanium, vanadium, chromium, manganese, iron, cobalt, nickel, copper, or a combination thereof. (1) The aluminum or silicon and (2) the other metal has a weight ratio of 60:40 to 99.5:0.5. The first passivation layer is disposed between the top surface of the nitride ceramic substrate and the first copper layer.

In some embodiments, the nitride ceramic substrate comprises aluminum nitride ceramic substrate or silicon nitride ceramic substrate.

In some embodiments, the nitride ceramic substrate has a thickness of 0.3 mm to 1 mm.

In some embodiments, the first passivation layer has a thickness of 1 μm to 5 μm.

In some embodiments, the first passivation layer has a thickness of 1 μm to 2 μm.

In some embodiments, the first copper layer has a thickness of 0.1 mm to 0.3 mm.

In some embodiments, the direct bonded copper ceramic substrate further includes a second passivation layer and a second copper layer. The second passivation layer includes aluminum oxide or silicon oxide doped with another metal. The other metal is titanium, vanadium, chromium, manganese, iron, cobalt, nickel, copper, or a combination thereof. (3) The aluminum or silicon and (4) the other metal have a weight ratio of 60:40 to 99.5:0.5. The second passivation layer is disposed between the bottom surface of the nitride ceramic substrate and the second copper layer.

In some embodiments, the second passivation layer has a thickness of 1 μm to 5 μm.

In some embodiments, the second passivation layer has a thickness of 1 μm to 2 μm.

In some embodiments, the second copper layer has a thickness of 0.1 mm to 0.3 mm.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
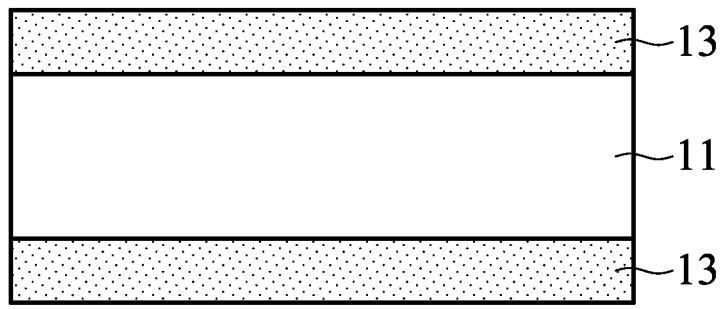
FIGS. 1 to 3 show a method of forming a direct bonded copper ceramic substrate.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In one embodiment, a nitride ceramic substrate 11 of nitride such as aluminum nitride (AlN) or silicon nitride ($Si_3N_4$) is provided, and surfaces of the nitride ceramic substrate 11 are cleaned. In one embodiment, the nitride ceramic substrate 11 has a thickness of 0.3 mm to 1 mm. If the thickness of the nitride ceramic substrate 11 is too thin, the substrate will break easily due to the substrate strength cannot resist the thermal stress introduced by copper bonding. If the thickness of the nitride ceramic substrate 11 is too thick, the interfacial thermal resistance will be too high, and the thermal conductivity vertical to the substrate surface is too poor to efficiently dissipate the heat of the IGBT chip. The performance of the product therefore suffers. For example, the nitride ceramic substrate can be alkaline washed, and the substrate surface is then neutralized by de-ionized water. The surface of the nitride ceramic substrate 11 is then dried, and precursor layers 13 containing titanium, vanadium, chromium, manganese, iron, cobalt, nickel, copper, or a combination thereof are formed on the top surface and the bottom surface of the nitride ceramic substrate 11, as shown in FIG. 1. For example, the precursor layer 13 can be formed by deposition, powder laying, printing, spray coating, or coating.

Figure 2:
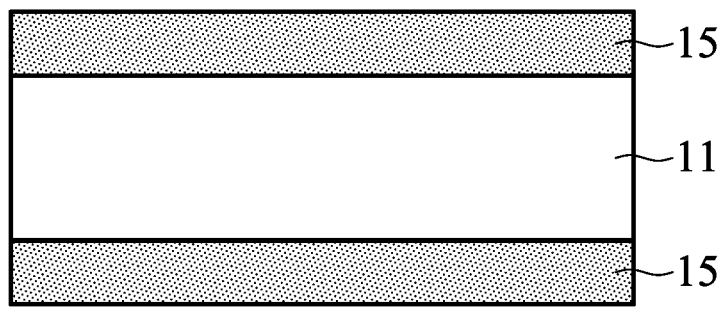

Subsequently, the nitride ceramic substrate 11 having precursor layers 13 on its top surface and bottom surface was heated to 1000° C. to 1300° C. and kept at 1000° C. to 1300° C. for 0.1 hours to 6 hours, thereby converting the precursor layers 13 to passivation layers 15, as shown in FIG. 2. In one embodiment, the environment of heating the precursor layers 13 has an oxygen concentration of 100 ppm to 1%. If the oxygen concentration is too low, the passivation element cannot result in passivation effect. If the oxygen concentration is too high, the passivation layer will be too thick. After the above steps, the passivation layers 15 formed on the top surface and the bottom surface of the nitride ceramic substrate 11 includes aluminum oxide (when the nitride ceramic substrate 11 is aluminum nitride) or silicon oxide (when the nitride ceramic substrate 11 is silicon nitride) doped with titanium, vanadium, chromium, manganese, iron, cobalt, nickel, copper, or a combination thereof. The doped element corresponds to the composition of the precursor layers 13. In the passivation layers 15, (1) the aluminum or silicon and (2) the other doping metal (e.g. titanium, vanadium, chromium, manganese, iron, cobalt, nickel, copper, or a combination thereof) have a weight ratio of 60:40 to 99.5:0.5. If the other doping element ratio is too low, there will be not doping effect. If the other doping element ratio is too high, it cannot form the passivation layer to provide bonding. In one embodiment, the passivation layer 15 has a thickness of 1 µm to 5 µm. In one embodiment, the passivation layer 15 has a thickness of 1 µm to 2 µm. If the passivation layer 15 is too thin, it cannot efficiently help the copper foil bond to the nitride ceramic substrate 11. If the passivation layer 15 is too thick, the adhesive strength will be lowered.

Figure 3:
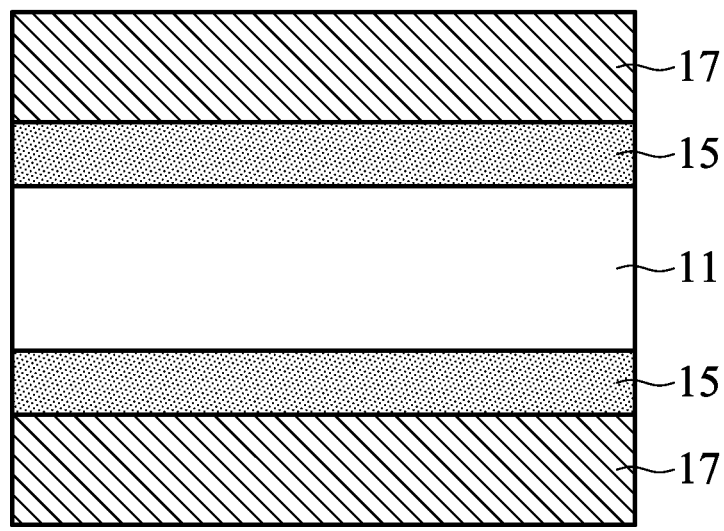

Subsequently, the surfaces of a copper foil 17 are pre-oxidized on the top surface and bottom surface of the copper foil 17. In one embodiment, the copper foil 17 has a thickness of 0.1 mm to 0.3 mm. The nitride ceramic substrate 11 having the passivation layers 15 on its top surface and bottom surface is interposed between two pre-oxidized copper foils 17 under an inert atmosphere (low oxygen concentration, such as 20 ppm), and heated to 1050° C. to 1080° C. for bonding the copper foils 17 to the nitride ceramic substrate 11 through the passivation layers 15, as shown in FIG. 3. As such, a direct bonded copper ceramic substrate is obtained, which has excellent copper foil peel strength (e.g. not easily peeled). As shown in transmission X-ray images (Computed Tomography, CT), the passivation layer 15 (titanium, vanadium, chromium, manganese, iron, cobalt, nickel, copper, or a combination thereof doped aluminum oxide or silicon oxide) after bonding has much fewer and smaller bubbles than the passivation layer of pure aluminum oxide after bonding.

Figure 4:
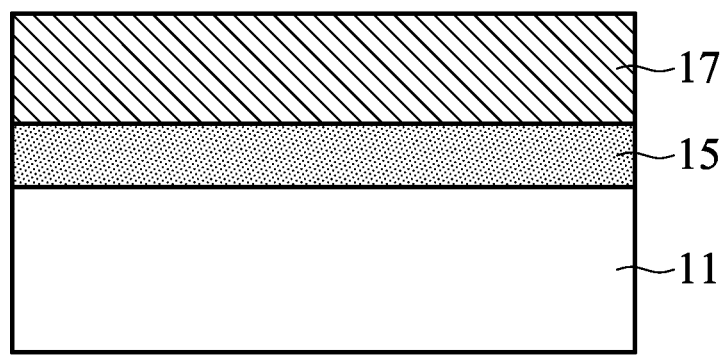
FIG. 4 shows a direct bonded copper ceramic substrate.

Alternatively, the passivation layer 15 and the copper foil 17 are formed on only one side of the nitride ceramic substrate 11, as shown in FIG. 4.

The direct bonded copper ceramic substrate may serve as a circuit board of a high power module to support the IGBT chips of high voltage and high current. The high power module can be utilized in electric vehicles, wind turbines, power plants, or the like.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Comparative Example 1

A copper foil of oxygen free copper was cut to a size of 4.25 inch×4.25 inch×0.3 mm. The top surface and bottom surface of the cut copper foil was polished by sand belt. The polished copper foil was cleaned by sonicated and then heated under atmosphere to 250° C. and kept at 250° C. for 30 minutes. The treated copper foil was stored in vacuum to be used later.

The aluminum oxide substrate commercially available from Kyocera had a size of 4.25 inch×4.25 inch×0.635 mm and a surface roughness of 0.6 µm to 0.8 µm. The aluminum oxide substrate was put in a 5% NaOH aqueous solution to be sonicated for 3 minutes for alkaline washing the aluminum oxide substrate, and then put into de-ionized water to be sonicated for 3 minutes to neutralize the alkaline washed surface of the aluminum oxide substrate. The aluminum oxide substrate was then spun and heated to 120° C. and kept at 120° C. for 10 minutes to dry the aluminum oxide substrate. The above steps could clean the top surface and the bottom surface of the aluminum oxide substrate.

The surface cleaned aluminum oxide substrate was interposed between the two treated copper foil to perform a direct bonded copper (DBC) process under oxygen of 20 ppm. The DBC process was kept at 700° C. for 5 minutes, kept at 900° C. for 5 minutes, and kept at 1056° C. for 5 minutes, in which the heating rate was 40° C./minute. As such, the direct bonded copper ceramic substrate of copper foil/aluminum oxide substrate/copper foil was obtained, which had copper foil peel strength of 66N/cm (tested by the standard ASTM D903).

Comparative Example 2

The copper foil was treated by the method in Comparative Example 1. The aluminum nitride substrate commercially available from Maruwa had a size of 4.25 inch×4.25 inch× 0.635 mm and a surface roughness of 0.2 µm to 0.8 µm. The aluminum nitride substrate was put in a 5% NaOH aqueous solution to be sonicated for 3 minutes for alkaline washing the aluminum nitride substrate, and then put into de-ionized water to be sonicated for 3 minutes to neutralize the alkaline washed surface of the aluminum nitride substrate. The aluminum nitride substrate was then spun and heated to 120° C. and kept at 120° C. for 10 minutes to dry the aluminum nitride substrate. The above steps could clean the top surface and the bottom surface of the aluminum nitride substrate.

The cleaned aluminum nitride substrate was pre-heated under atmosphere, which was kept at 1100° C. for 360 minutes to form aluminum oxide passivation layers on the top surface and bottom surface of the aluminum nitride substrate, respectively. The passivation layer had a thickness of 8 μm.

The aluminum nitride substrate having aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/aluminum oxide passivation layer/aluminum nitride substrate/aluminum oxide passivation layer/copper foil was obtained, which had copper foil peel strength of 44N/cm (tested by the standard ASTM D903).

Comparative Example 3

The copper foil was treated by the method in Comparative Example 1. The surfaces of the aluminum nitride substrate were cleaned by the method in Comparative Example 2. The cleaned aluminum nitride substrate was pre-heated under atmosphere, which was kept at 1020° C. for 360 minutes to form aluminum oxide passivation layers on the top surface and bottom surface of the aluminum nitride substrate, respectively. The passivation layer had a thickness of 2 μm.

The aluminum nitride substrate having aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/aluminum oxide passivation layer/aluminum nitride substrate/aluminum oxide passivation layer/copper foil was obtained, which had copper foil peel strength of 34N/cm (tested by the standard ASTM D903).

Comparative Example 4

The copper foil was treated by the method in Comparative Example 1. The surfaces of the aluminum nitride substrate were cleaned by the method in Comparative Example 2. Tin chloride ($SnCl_2$) layers with a thickness of 1 μm were coated on the top surface and the bottom surface of the cleaned aluminum nitride substrate. The aluminum nitride substrate having tin chloride layers on its top surface and bottom surface was pre-heated under atmosphere, which was kept at 1100° C. for 360 minutes to form tin doped aluminum oxide passivation layers on the top surface and bottom surface of the aluminum nitride substrate, respectively. The passivation layer had a thickness of 8 μm, and the aluminum and tin in the passivation layer had a weight ratio of 98:2 (measured by Energy Dispersive X-ray Spectroscopy (EDS)).

The aluminum nitride substrate having tin doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/tin doped aluminum oxide passivation layer/aluminum nitride substrate/tin doped aluminum oxide passivation layer/copper foil was obtained, which had copper foil peel strength of 30N/cm (tested by the standard ASTM D903).

Example 1

The copper foil was treated by the method in Comparative Example 1. The surfaces of the aluminum nitride substrate were cleaned by the method in Comparative Example 2. Titanium oxide ($TiO_2$) layers with a thickness of 1 μm were coated on the top surface and the bottom surface of the cleaned aluminum nitride substrate. The aluminum nitride substrate having titanium oxide layers on its top surface and bottom surface was pre-heated under oxygen of 100 ppm, which was kept at 1100° C. for 360 minutes to form titanium doped aluminum oxide passivation layers on the top surface and bottom surface of the aluminum nitride substrate, respectively. The passivation layer had a thickness of 2 μm, and the aluminum and titanium in the passivation layer had a weight ratio of 90:10 (measured by EDS).

The aluminum nitride substrate having titanium doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/titanium doped aluminum oxide passivation layer/aluminum nitride substrate/titanium doped aluminum oxide passivation layer/copper foil was obtained, which had copper foil peel strength of 82N/cm (tested by the standard ASTM D903).

Example 2

The copper foil was treated by the method in Comparative Example 1. The surfaces of the aluminum nitride substrate were cleaned by the method in Comparative Example 2. Vanadium oxide ($V_2O_3$) layers with a thickness of 1 μm were coated on the top surface and the bottom surface of the cleaned aluminum nitride substrate. The aluminum nitride substrate having vanadium oxide layers on its top surface and bottom surface was pre-heated under 1% oxygen, which was kept at 1100° C. for 360 minutes a to form vanadium doped aluminum oxide passivation layers on the top surface and bottom surface of the aluminum nitride substrate, respectively. The passivation layer had a thickness of 4 and the aluminum and vanadium in the passivation layer had a weight ratio of 85:15 (measured by EDS).

The aluminum nitride substrate having vanadium doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/vanadium doped aluminum oxide passivation layer/aluminum nitride substrate/vanadium doped aluminum oxide passivation layer/copper foil was obtained, which had copper foil peel strength of 81N/cm (tested by the standard ASTM D903).

Example 3

The copper foil was treated by the method in Comparative Example 1. The surfaces of the aluminum nitride substrate were cleaned by the method in Comparative Example 2. Chromium oxide ($Cr_2O_3$) layers with a thickness of 1 μm were coated on the top surface and the bottom surface of the cleaned aluminum nitride substrate. The aluminum nitride substrate having vanadium oxide layers on its top surface and bottom surface was pre-heated under oxygen of 500 ppm, which was kept at 1100° C. for 360 minutes to form chromium doped aluminum oxide passivation layers on the top surface and bottom surface of the aluminum nitride substrate, respectively. The passivation layer had a thickness of 3 μm, and the aluminum and chromium in the passivation layer had a weight ratio of 92:8 (measured by EDS).

The aluminum nitride substrate having chromium doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/chromium doped aluminum oxide passivation layer/aluminum nitride substrate/chromium doped aluminum oxide passivation layer/copper foil was obtained, which had copper foil peel strength of 79N/cm (tested by the standard ASTM D903).

Example 4

The copper foil was treated by the method in Comparative Example 1. The surfaces of the aluminum nitride substrate were cleaned by the method in Comparative Example 2. Manganese oxide ($MnO_2$) layers with a thickness of 1 μm were coated on the top surface and the bottom surface of the cleaned aluminum nitride substrate. The aluminum nitride substrate having manganese oxide layers on its top surface and bottom surface was pre-heated under 1% oxygen, which was kept at 1100° C. for 360 minutes to form manganese doped aluminum oxide passivation layers on the top surface and bottom surface of the aluminum nitride substrate, respectively. The passivation layer had a thickness of 2 μm, and the aluminum and manganese in the passivation layer had a weight ratio of 84:16 (measured by EDS).

The aluminum nitride substrate having manganese doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/manganese doped aluminum oxide passivation layer/aluminum nitride substrate/manganese doped aluminum oxide passivation layer/copper foil was obtained, which had copper foil peel strength of 85N/cm (tested by the standard ASTM D903).

Example 5

The copper foil was treated by the method in Comparative Example 1. The surfaces of the aluminum nitride substrate were cleaned by the method in Comparative Example 2. Iron oxide ($Fe_2O_3$) layers with a thickness of 1 μm were coated on the top surface and the bottom surface of the cleaned aluminum nitride substrate. The aluminum nitride substrate having iron oxide layers on its top surface and bottom surface was pre-heated under oxygen of 500 ppm, which was kept at 1100° C. for 360 minutes to form iron doped aluminum oxide passivation layers on the top surface and bottom surface of the aluminum nitride substrate, respectively. The passivation layer had a thickness of 2 μm, and the aluminum and iron in the passivation layer had a weight ratio of 78:22 (measured by EDS).

The aluminum nitride substrate having iron doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/iron doped aluminum oxide passivation layer/aluminum nitride substrate/iron doped aluminum oxide passivation layer/copper foil was obtained, which had copper foil peel strength of 69N/cm (tested by the standard ASTM D903).

Example 6

The copper foil was treated by the method in Comparative Example 1. The surfaces of the aluminum nitride substrate were cleaned by the method in Comparative Example 2. Nickel oxide (NiO) layers with a thickness of 1 μm were coated on the top surface and the bottom surface of the cleaned aluminum nitride substrate. The aluminum nitride substrate having nickel oxide layers on its top surface and bottom surface was pre-heated under 1% oxygen, which was kept at 1100° C. for 360 minutes to form nickel doped aluminum oxide passivation layers on the top surface and bottom surface of the aluminum nitride substrate, respectively. The passivation layer had a thickness of 4 and the aluminum and nickel in the passivation layer had a weight ratio of 80:20 (measured by EDS).

The aluminum nitride substrate having nickel doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/nickel doped aluminum oxide passivation layer/aluminum nitride substrate/nickel doped aluminum oxide passivation layer/copper foil was obtained, which had copper foil peel strength of 70N/cm (tested by the standard ASTM D903).

Example 7

The copper foil was treated by the method in Comparative Example 1. The surfaces of the aluminum nitride substrate were cleaned by the method in Comparative Example 2. Cuprous oxide ($Cu_2O$) layers with a thickness of 1 μm were coated on the top surface and the bottom surface of the cleaned aluminum nitride substrate. The aluminum nitride substrate having cuprous oxide layers on its top surface and bottom surface was pre-heated under oxygen of 500 ppm, which was kept at 1100° C. for 360 minutes to form copper doped aluminum oxide passivation layers on the top surface and bottom surface of the aluminum nitride substrate, respectively. The passivation layer had a thickness of 3 and the aluminum and copper in the passivation layer had a weight ratio of 65:35 (measured by EDS).

The aluminum nitride substrate having copper doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/copper doped aluminum oxide passivation layer/aluminum nitride substrate/copper doped aluminum oxide passivation layer/copper foil was obtained, which had copper foil peel strength of 65N/cm (tested by the standard ASTM D903).

Example 8

The copper foil was treated by the method in Comparative Example 1. The surfaces of the aluminum nitride substrate were cleaned by the method in Comparative Example 2. A titanium layer with a thickness of 100 nm, a manganese layer with a thickness of 100 nm, and a copper layer with a thickness of 100 nm was formed on the top surface (and the bottom surface) of the cleaned aluminum nitride substrate by physical vapor deposition. The aluminum nitride substrate having titanium, manganese, and copper layers on its top surface and bottom surface was pre-heated under oxygen of 500 ppm, which was kept at 1100° C. for 360 minutes to form titanium, manganese, and copper doped aluminum oxide passivation layers on the top surface and bottom surface of the aluminum nitride substrate, respectively. The passivation layer had a thickness of 3 and the aluminum and titanium in the passivation layer had a weight ratio of 90:10, aluminum and manganese in the passivation layer had a weight ratio of 90:10, and aluminum and copper in the passivation layer had a weight ratio of 90:10 (measured by EDS).

The aluminum nitride substrate having titanium, manganese, and copper doped aluminum oxide passivation layers on its top surface and bottom surface was interposed between the two treated copper foil to perform a DBC process under oxygen of 20 ppm. The DBC process was kept at 700° C. for 5 minutes, then at 900° C. for 5 minutes, and then at 1056° C. for 5 minutes, in which the heating rate was 40° C./minute. As such, the direct bonded copper ceramic substrate of copper foil/titanium, manganese, and copper doped aluminum oxide passivation layer/aluminum nitride substrate/titanium, manganese, and copper doped aluminum oxide passivation layer/copper foil was obtained, which had copper foil peel strength of 85N/cm (tested by the standard ASTM D903).

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A direct bonded copper ceramic substrate, comprising:
a nitride ceramic substrate;
a first passivation layer including aluminum oxide or silicon oxide doped with another metal, the other metal is titanium, vanadium, chromium, manganese, iron, nickel, or a combination thereof, and (1) the aluminum or silicon and (2) the other metal have a weight ratio of 60:40 to 99.5:0.5; and
a first copper layer,
wherein the first passivation layer is disposed between the top surface of the nitride ceramic substrate and the first copper layer.

2. The direct bonded copper ceramic substrate as claimed in claim 1, wherein the nitride ceramic substrate comprises aluminum nitride ceramic substrate or silicon nitride ceramic substrate.

3. The direct bonded copper ceramic substrate as claimed in claim 1, wherein the nitride ceramic substrate has a thickness of 0.3 mm to 1 mm.

4. The direct bonded copper ceramic substrate as claimed in claim 1, wherein the first passivation layer has a thickness of 1 μm to 5 μm.

5. The direct bonded copper ceramic substrate as claimed in claim 1, wherein the first passivation layer has a thickness of 1 μm to 2 μm.

6. The direct bonded copper ceramic substrate as claimed in claim 1, wherein the first copper layer has a thickness of 0.1 mm to 0.3 mm.

7. The direct bonded copper ceramic substrate as claimed in claim 1, further comprising:
a second passivation layer including aluminum oxide or silicon oxide doped with another metal, the other metal is titanium, vanadium, chromium, manganese, iron, cobalt, nickel, copper, or a combination thereof, and (3) the aluminum or silicon and (4) the other metal have a weight ratio of 60:40 to 99.5:0.5; and
a second copper layer,
wherein the second passivation layer is disposed between the bottom surface of the nitride ceramic substrate and the second copper layer.

8. The direct bonded copper ceramic substrate as claimed in claim 7, wherein the second passivation layer has a thickness of 1 μm to 5 μm.

9. The direct bonded copper ceramic substrate as claimed in claim 7, wherein the second passivation layer has a thickness of 1 μm to 2 μm.

10. The direct bonded copper ceramic substrate as claimed in claim 7, wherein the second copper layer has a thickness of 0.1 mm to 0.3 mm.

* * * * *